United States Patent [19]

Sasaki

[11] Patent Number: 4,468,855

[45] Date of Patent: Sep. 4, 1984

[54] METHOD OF MAKING ALUMINUM GATE SELF-ALIGNED FET BY SELECTIVE BEAM ANNEALING THROUGH REFLECTIVE AND ANTIREFLECTIVE COATINGS

[75] Inventor: Nobuo Sasaki, Kawasaki, Japan

[73] Assignee: Fujitsu Limited, Kawasaki, Japan

[21] Appl. No.: 405,269

[22] Filed: Aug. 4, 1982

[30] Foreign Application Priority Data

Aug. 5, 1981 [JP] Japan .................. 56-122657

[51] Int. Cl.³ .................. H01L 21/265; H01L 21/263
[52] U.S. Cl. .................. 29/576 B; 29/576 T; 29/571; 148/1.5; 357/91; 427/53.1
[58] Field of Search .............. 148/1.5; 29/576 B, 571, 29/576 T; 357/91; 427/53.1

[56] References Cited

U.S. PATENT DOCUMENTS

| | | | |
|---|---|---|---|
| 4,243,433 | 1/1981 | Gibbons | 148/1.5 |
| 4,284,659 | 8/1981 | Jaccodine et al. | 427/53.1 |
| 4,379,727 | 4/1983 | Hansen et al. | 148/1.5 |
| 4,381,201 | 4/1983 | Sakurai | 148/1.5 |

FOREIGN PATENT DOCUMENTS 55-0120365  8/1980  Japan .

OTHER PUBLICATIONS

Fowler et al., IBM-TDB, 22, (1980), 5473.
Koyanagi et al., Appl. Phys. Letts. 35, (1979), 621.
Tamura et al., J. Appl. Phys. 50, (1979), 3783.
Iwamatsu et al., J. Electrochemical Soc. 128, (Feb. 1981), 384.

*Primary Examiner*—Upendra Roy
*Attorney, Agent, or Firm*—Staas & Halsey

[57] ABSTRACT

A method for producing a semiconductor device comprising the steps of forming a gate insulating layer (3) on a semiconductor substrate having a first conductivity (1) and forming an aluminum gate electrode (4) on the gate insulating layer (3); impurity doped regions (5, 6) are then formed in the semiconductor substrate (1) by means of implantation of impurity ions having a second conductivity opposite that of the first conductivity into the semiconductor substrate (1) using the aluminum gate electrode (4) as a masking material for annealing the impurity doped regions (5, 6). The annealing process occurs by irradiating a beam on the impurity doped regions (5, 6) including the aluminum gate electrode (4). After forming the impurity doped regions (5, 6) in the semiconductor substrate (1), at least the upper surface of the aluminum gate electrode (4) is covered with an insulating layer (7).

10 Claims, 4 Drawing Figures

4,468,855

METHOD OF MAKING ALUMINUM GATE SELF-ALIGNED FET BY SELECTIVE BEAM ANNEALING THROUGH REFLECTIVE AND ANTIREFLECTIVE COATINGS

BACKGROUND OF THE INVENTION

1. Field of the Invention

The present invention relates to a method for producing a semiconductor device, more particularly to a method for forming impurity doped regions in a semiconductor substrate by using the self-alignment method wherein aluminum gate electrodes are used as a masking material.

2. Description of the Prior Art

The self-alignment method has conventionally been applied to the formation of source and drain regions of field effect transistors (FET) in semiconductor substrates. Since no space is necessary for position alignment of photo masking material in the self-alignment method, self-alignment is a very effective technique to increase the degree of semiconductor device integration.

After gate electrodes are formed on gate insulating layers, heat treatment is carried out at 500° C. to activate the source and drain regions using the gate electrodes as a masking material. Therefore, in the self-alignment method, it is necessary that the material of conventional gate electrodes have a high heat resistance. Thus, polycrystalline silicon, which has a high heat resistance, has usually been used for conventional gate electrodes. Even considerable doping of impurities into the polycrystalline, however, fails to reduce the electrical resistance of the doped polycrystalline to the level of aluminum. Thus, the switching speed of the semiconductor device is lowered.

In recent years, laser annealing of semiconductors has been carried out to activate the source and drain regions. While aluminum has poor heat resistance, it reflects the laser beam well. Therefore, it should be possible to use aluminum for the masking material to form the source and drain regions by the ion-implanting or doping method, then anneal the regions by laser irradiation so as to produce FET's having aluminum gate electrodes by the self-alignment process. As a result, the integration density and switching speed of semiconductor devices can be improved. Japanese Unexamined Patent Publication No. 55-102271 describes the use of aluminum as gate electrodes and annealing an ion-doped layer by laser beam irradiation using the aluminum gate electrode as a masking material. However, in the process described in Japanese Unexamined Patent Publication No. 55-102271, the laser beam irradiation has a detrimental effect on the aluminum gate electrodes. Namely, the irradiation energy of the laser beam on the aluminum is so strong that it damages the aluminum despite much of it being reflected by the aluminum. Irradiation of 2.2 joules of energy by a ruby laser beam, for example, will fuse and further disperse the aluminum of gate electrodes. Irradiation of even 0.31 joules of energy by a laser beam will produce a crack network at the surface of the aluminum gate electrodes. Such irradiation energy therefore damages the aluminum gate electrodes themselves.

On the other hand, while irradiation of a low amount of energy by a laser beam, for example, 0.146 joules will not damage the aluminum, it will also not activate the impurity doped regions enough to lower the sheet resistivity. Namely, a region into which arsenic ion (As+) was doped under conditions $5 \times 10^{15}$ cm$^{-2}$ and 100 KeV energy can be reduced to only a sheet resistivity of 100 $\Omega/\square$ by an irradiation energy of 0.146 joules compared with a sheet resistivity of 50 $\Omega/\square$ by an irradiation energy of 0.3 joule.

As explained above, a high irradiation energy of a laser beam on aluminum gate electrodes will damage the aluminum, and a low irradiation energy of a laser beam on aluminum gate electrodes will not be sufficient to activate the impurity doped region to lower the sheet resistivity.

SUMMARY OF THE INVENTION

It is an object of the present invention to provide a method for producing a semiconductor device having an aluminum gate electrode in which a low sheet resistivity can be obtained by means of beam annealing at the ion doped region without damage to the aluminum electrode, whereby high integration density and high switching speed can be obtained.

According to the present invention there is provided a method for producing a semiconductor device comprising the steps of:

forming a gate insulating layer on one conductive a semiconductor substrate having a first conductivity;

forming an aluminum gate electrode on the gate insulating layer;

forming an impurity doped region in the semiconductor substrate by means of doping the semiconductor substrate with an impurity having a second conductivity opposite that of the first conductivity, using the aluminum gate electrode as a masking material;

covering at least the upper surface of the aluminum gate electrode with an insulating layer; and annealing the impurity doped regions by irradiating a laser beam on said impurity doped regions including the aluminum gate electrode.

BRIEF DESCRIPTION OF THE DRAWINGS

Further advantages and details of the present invention will now be explained with reference to the accompanying drawings, in which.

DESCRIPTION OF THE PREFERRED EMBODIMENT

Before the present invention was conceived, various studies were carried out. These studies showed that the reason for the above-described crack network was that when the aluminum gate electrode was heated by beam irradiation, it expanded. During the process of cooling by heat dispersion from the surface, however, the surface would contract first.

Therefore, formation of an insulating layer on the aluminum gate electrode before laser annealing allows sufficient annealing of the impurity doped region and the aluminum gate electrode without formation of the crack network. This is because the insulating layer suppresses heat dispersion from the surface of the aluminum gate electrode and results in an uneven temperature distribution in the aluminum gate electrode. At the same time, the insulating layer dynamically prevents the aluminum gate electrode from the cracking.

Figure 1:
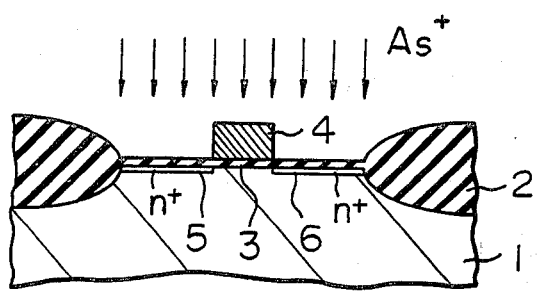
FIGS. 1 to 3 are sectional views of a semiconductor device in main portions of a process according to the present invention.

Referring to FIG. 1, for example, a usual technique is used to form, on a p-type silicon semiconductor substrate 1, a silicon dioxide field insulating layer 2, silicon dioxide gate insulating layer 3, and aluminum gate electrode 4.

An ion implantation technique is then used to dope arsenic ions into the p-type silicon substrate 1 at $5 \times 10^{15}$ cm$^{-2}$ and 100 KeV of energy so as to form n$^+$-type source region 5 and n$^+$-type drain region 6 into p-type silicon substrate 1.

Figure 2:
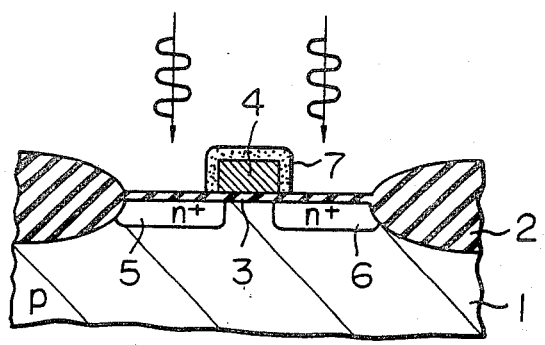

Referring to FIG. 2, aluminum oxide layer 7 is formed on the surface of the aluminum gate electrode 4 by oxidation, for example, utilizing the anode oxidation process. This oxidation process of aluminum may be carried out prior to the ion implanting process. Then, a YAG (Yttrium-aluminum-garnet) laser beam having wavelength of 1.06 μm is irradiated on the impurity doped region including the aluminum gate electrode to anneal the source region 5 and the drain region 6, producing a sheet resistivity of regions 5 and 6 of approximately 50 Ω/□. In this case, the crack network does not occur in the aluminum gate electrode 4.

Figure 3:
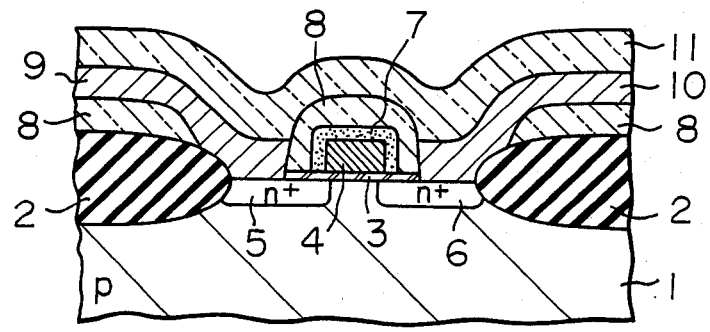

Referring to FIG. 3, a well known technique is used to form a phosphosilicate glass layer 8 on the device shown in FIG. 2. Another electrode contact hole is formed by patterning the phosphosilicate glass layer 8 and the silicon dioxide gate insulating layer 3. An aluminum layer is formed in the electrode contact hole and on phosphosilicate glass layer 8. Source electrode 9 and drain electrode 10 are formed by patterning the aluminum layer. A phosphosilicate glass layer 11 is formed on the source electrode 9, phosphosilicate glass layer a, and drain electrode 10 and, thus, an integrated circuit (IC) chip is produced.

In the present invention aluminum oxide layer 7 may be changed to another insulating layer, for example, a silicon nitride layer or a silicon dioxide layer. Further, in addition to the anode oxidation process mentioned above, a plasma oxidation process, chemical vapor deposition process (CVD process) and so forth may be used to form the aluminum oxide layer 7.

Figure 4:
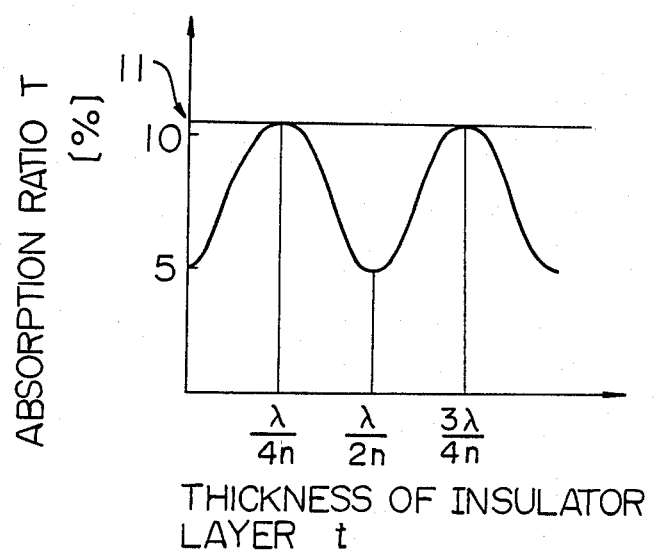
FIG. 4 is a graph of the relation between the laser beam absorption ratio and the thickness of insulating layer.

The change in the laser beam absorption is a ratio of the aluminum layer as a function of the thickness of the insulating layer, in the case where an insulating layer is present on the aluminum layer, as shown in FIG. 4. This change is due to the interference of light.

As is apparent from FIG. 4, it is effective that the thickness t of the insulating layer be equal to the value $\lambda m/2n$; wherein n is the index of refraction of the insulating layer on the aluminum layer, $\lambda$ is the beam wavelength in a vacuum, and m is a positive integer. The data shown in FIG. 4 was obtained by using a YAG laser having a wavelength of 1.06 μm.

Therefore, in the case of a ruby laser beam having a wavelength of 0.694 μm, to minimize the absorption ratio when using aluminum oxide, which has an index of refraction of 1.77, the thickness of the aluminum oxide layer should be 1960 Å. In the case of a YAG laser beam having a wavelength of 1.03 μm, to minimize the absorption rate when using aluminum oxide, the thickness of the aluminum oxide layer should be 2900 Å. The above thicknesses of the aluminum oxide layers can be calculated from the formula, $\lambda m/2n$. As can be seen from FIG. 4, a thickness of $\lambda/12n$, considerably lower than $\lambda/4n$, can also produce a roughly minimum absorption rate T. On the other hand, to activate the source and drain regions under the gate insulating layer, a large absorption ratio is preferable. Therefore, the thickness of the gate insulating layer should be formed to be $\lambda(2m-1)/4n$; wherein n is the index of refraction of the insulating layer, $\lambda$ is a beam wavelength in a vacuum, and m is a positive integer.

In the above examples, only a laser beam, in particular a ruby laser beam or YAG laser beam, was used as the beam by which impurity doped regions were annealed. However, in addition to a laser beam, an electron beam, lamp beam, and so forth may be used.

According to the present invention, as explained above, at least the upper surface of the aluminum gate electrode is covered with an insulating layer of a thickness selected by the formula $\lambda m/2n$ so that the aluminum gate electrode is not damaged by the irradiating beam and further the source and drain regions are activated, with the result that a low sheet resistivity can be obtained.

Therefore, the present invention is advantageous for the production of a semiconductor device including an FET produced by the self-alignment method and using an aluminum gate electrode.

While preferred embodiments of the invention have been shown, it will be obvious that modifications may be made within the scope of the disclosure of the specification.

I claim:

1. A method for producing a semiconductor device formed on a semiconductor substrate of a first conductivity type, comprising the steps of:
   (a) forming a gate insulating layer on the semiconductor substrate;
   (b) forming an aluminum gate electrode on the gate insulating layer;
   (c) forming an impurity doped region in the semiconductor substrate by doping the semiconductor substrate with an impurity having a second conductivity type opposite that of the first conductivity type, using the aluminum gate electrode as a masking material;
   (d) covering at least the upper surface of the aluminum gate electrode with an insulating layer; and
   (e) annealing the impurity doped region by irradiating a beam on the impurity doped region and the aluminum gate electrode.

2. A method according to claim 1, wherein said forming step a comprises forming the gate insulating layer having a thickness t equal to the value calculated by the formula $\lambda(2m-1)/4n$, wherein n is the index of refraction of the gate insulating layer, $\lambda$ is the beam wavelength in a vacuum, and m is a positive integer.

3. A method according to claim 1, wherein said covering step d comprises covering the aluminum gate electrode with the insulating layer having a thickness t equal to the value calculated by the formula $\lambda m/2n$, wherein n is the index of refraction of the insulating layer, $\lambda$ is the beam wavelength in a vacuum, and m is a positive integer.

4. A method according to claim 1, 2 or 3, wherein the beam in said annealing step e is selected from the group consisting of a laser beam, an electron beam, and a lamp beam.

5. A method according to claim 1, 2 or 3, wherein said covering step d comprises covering the aluminum layer with the insulating layer which comprises aluminum oxide.

6. A method according to claim 1, 2 or 3; wherein said covering step d comprises covering the aluminum layer with the insulating layer which comprises silicon nitride.

7. A method according to claim 1, 2 or 3, wherein said covering step d comprises covering the aluminum layer with the insulating layer which comprises silicon dioxide.

8. A method according to claim 4, wherein said covering step d comprises covering the aluminum layer with the insulating layer which comprises aluminum oxide.

9. A method according to claim 4, wherein said covering step d comprises covering the aluminum layer with the insulating layer which comprises silicon nitride.

10. A method according to claim 4, wherein said covering step d comprises covering the aluminum layer with the insulating layer which comprises silicon dioxide.

* * * * *

UNITED STATES PATENT AND TRADEMARK OFFICE
CERTIFICATE OF CORRECTION

PATENT NO.   :   4,468,855
DATED        :   SEPTEMBER 4, 1984
INVENTOR(S)  :   NOBUO SASAKI

It is certified that error appears in the above-identified patent and that said Letters Patent is hereby corrected as shown below:

```
Col. 2, line 25, delete "one conductive";
        line 40, "said" should be --the--.

Col. 3, line 13, delete "into";
        line 14, after "p-type" insert --in the--;
        line 36, "a" should be --8--.
```

Signed and Sealed this

Twelfth Day of March 1985

[SEAL]

Attest:

DONALD J. QUIGG

Attesting Officer — Acting Commissioner of Patents and Trademarks